(12) United States Patent
Liu et al.

(10) Patent No.: US 8,665,640 B2
(45) Date of Patent: *Mar. 4, 2014

(54) SPIN TORQUE TRANSFER CELL STRUCTURE UTILIZING FIELD-INDUCED ANTIFERROMAGNETIC OR FERROMAGNETIC COUPLING

(75) Inventors: Jun Liu, Boise, ID (US); Gurtej Sandhu, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/544,670

(22) Filed: Jul. 9, 2012

(65) Prior Publication Data
US 2012/0275218 A1 Nov. 1, 2012

Related U.S. Application Data

(63) Continuation of application No. 13/108,869, filed on May 16, 2011, now Pat. No. 8,218,357, which is a continuation of application No. 12/265,340, filed on Nov. 5, 2008, now Pat. No. 7,944,738.

(51) Int. Cl.
*G11C 11/00* (2006.01)
(52) U.S. Cl.
USPC .............................. 365/158; 365/171; 365/173
(58) Field of Classification Search
USPC .......................................... 365/158, 171, 173
See application file for complete search history.

(56) References Cited

U.S. PATENT DOCUMENTS

| | | | |
|---|---|---|---|
| 6,379,978 B2 | 4/2002 | Goebel et al. | |
| 6,424,563 B2 | 7/2002 | Honigschmid | |
| 6,490,217 B1 | 12/2002 | DeBrosse et al. | |
| 6,600,184 B1 | 7/2003 | Gill | |
| 6,714,442 B1 | 3/2004 | Nahas | |
| 6,847,547 B2 | 1/2005 | Albert et al. | |
| 6,896,975 B2 | 5/2005 | Lin et al. | |
| 6,956,764 B2 | 10/2005 | Engel et al. | |

(Continued)

FOREIGN PATENT DOCUMENTS

| | | |
|---|---|---|
| CN | 1497600 | 5/2004 |
| CN | 1777957 | 5/2006 |
| WO | WO2008010957 | 1/2008 |

OTHER PUBLICATIONS

Dick James; Chip Forensics, XP-001518080; A New Spin on MRAN; Chipworks, Ottawo, Ontario, Canada; pp. 46-47, Mar. 2007, Solid State Technology.

(Continued)

*Primary Examiner* — Huan Hoang
(74) *Attorney, Agent, or Firm* — Fletcher Yoder, P.C.

(57) ABSTRACT

A magnetic memory cell including a soft magnetic layer and a coupling layer, and methods of operating the memory cell are provided. The memory cell includes a stack with a free ferromagnetic layer and a pinned ferromagnetic layer, and a soft magnetic layer and a coupling layer may also be formed as layers in the stack. The coupling layer may cause antiferromagnetic coupling to induce the free ferromagnetic layer to be magnetized in a direction antiparallel to the magnetization of the soft magnetic layer, or the coupling layer may cause ferromagnetic coupling to induce the free ferromagnetic layer to be magnetized in a direction parallel to the magnetization of the soft magnetic layer. The coupling layer, through a coupling effect, reduces the critical switching current of the memory cell.

28 Claims, 5 Drawing Sheets

(56) References Cited

U.S. PATENT DOCUMENTS

| | | |
|---|---|---|
| 6,982,916 B2 | 1/2006 | Tsang |
| 6,992,359 B2 | 1/2006 | Nguyen et al. |
| 7,009,877 B1 | 3/2006 | Huai et al. |
| 7,042,762 B2 | 5/2006 | Nakamura et al. |
| 7,045,368 B2 | 5/2006 | Hong et al. |
| 7,088,609 B2 | 8/2006 | Valet |
| 7,126,202 B2 | 10/2006 | Huai et al. |
| 7,211,874 B2 | 5/2007 | Guo et al. |
| 7,224,601 B2 | 5/2007 | Panchula |
| 7,230,844 B2 | 6/2007 | Deak |
| 7,257,021 B2 | 8/2007 | Lienau et al. |
| 7,282,755 B2 | 10/2007 | Pakala et al. |
| 7,307,876 B2 | 12/2007 | Kent et al. |
| 7,310,265 B2 | 12/2007 | Zheng et al. |
| 7,339,819 B2 | 3/2008 | Johnson |
| 7,369,427 B2 | 5/2008 | Diao et al. |
| 7,372,722 B2 | 5/2008 | Jeong et al. |
| 7,430,135 B2 | 9/2008 | Huai et al. |
| 7,433,161 B2 | 10/2008 | Ikarashi et al. |
| 7,795,696 B2 * | 9/2010 | Mryasov et al. ............. 257/421 |
| 7,876,603 B2 | 1/2011 | Liu et al. |
| 7,944,738 B2 * | 5/2011 | Liu et al. ...................... 365/158 |
| 8,218,357 B2 * | 7/2012 | Liu et al. ...................... 365/158 |
| 8,310,861 B2 * | 11/2012 | Liu et al. ...................... 365/158 |
| 2005/0047198 A1 | 3/2005 | Engel et al. |
| 2005/0185455 A1 | 8/2005 | Huai |
| 2006/0017124 A1 | 1/2006 | Ho et al. |
| 2006/0028862 A1 * | 2/2006 | Min et al. ...................... 365/158 |
| 2006/0233018 A1 | 10/2006 | Tanizaki |
| 2006/0262594 A1 | 11/2006 | Kukumoto |
| 2007/0171694 A1 * | 7/2007 | Huai et al. .................... 365/145 |
| 2008/0049488 A1 | 2/2008 | Rizzo |
| 2008/0061388 A1 | 3/2008 | Diao et al. |
| 2008/0180991 A1 | 7/2008 | Wang |
| 2008/0197431 A1 | 8/2008 | Morise et al. |
| 2008/0225585 A1 | 9/2008 | Ranjan et al. |
| 2008/0265234 A1 | 10/2008 | Breitwisch et al. |
| 2010/0080036 A1 | 4/2010 | Liu et al. |
| 2010/0080048 A1 | 4/2010 | Liu et al. |

OTHER PUBLICATIONS

Stuart Parkin; Spin-Polarized Current in Spin Valves and Magnetic Tunnel Junctions; MRS Bulletin, pp. 389-394, vol. 31, May 2006.

Chinese Office Action for Chinese Application No. 200980144286.8 mailed May 10, 2013.

* cited by examiner

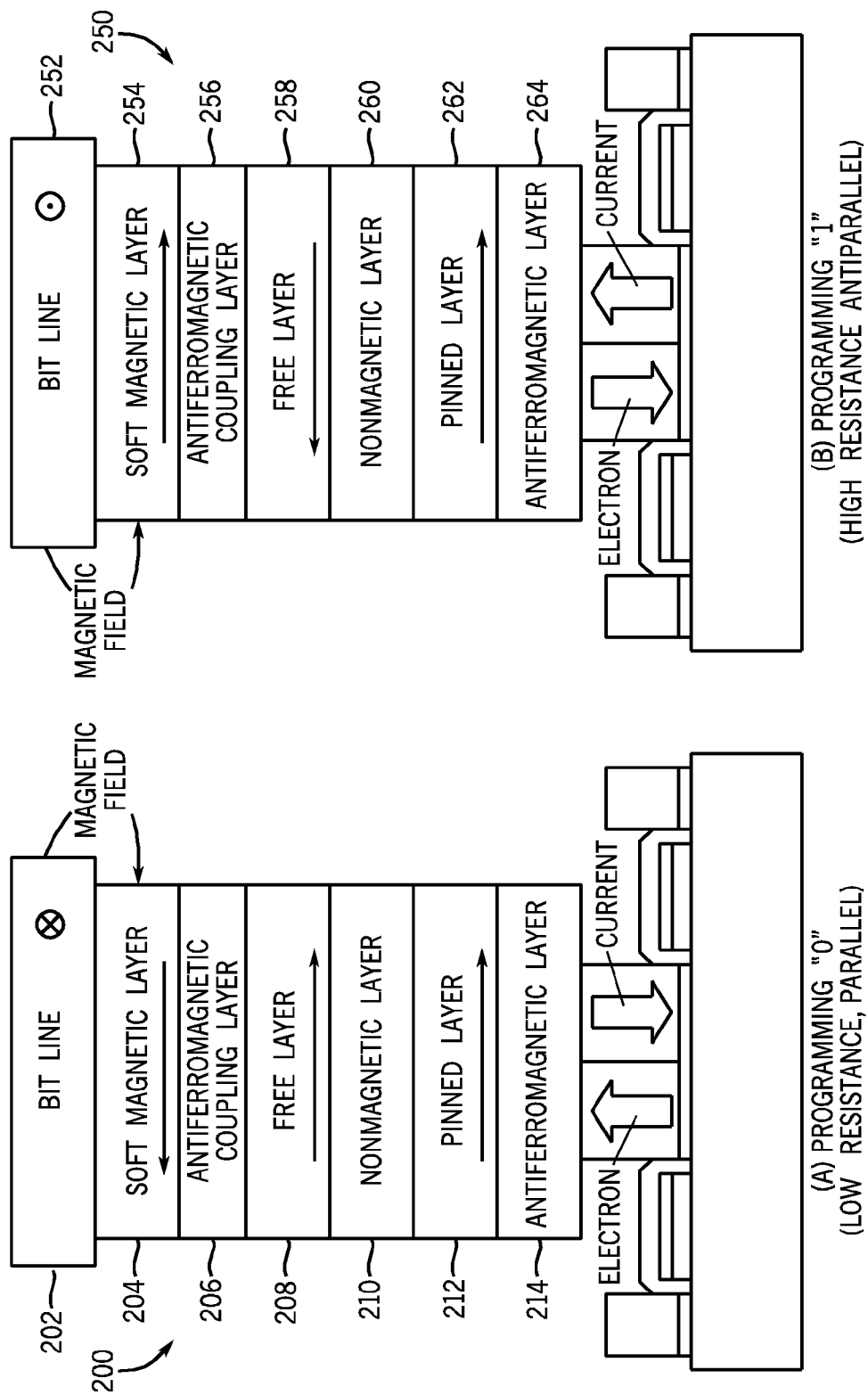

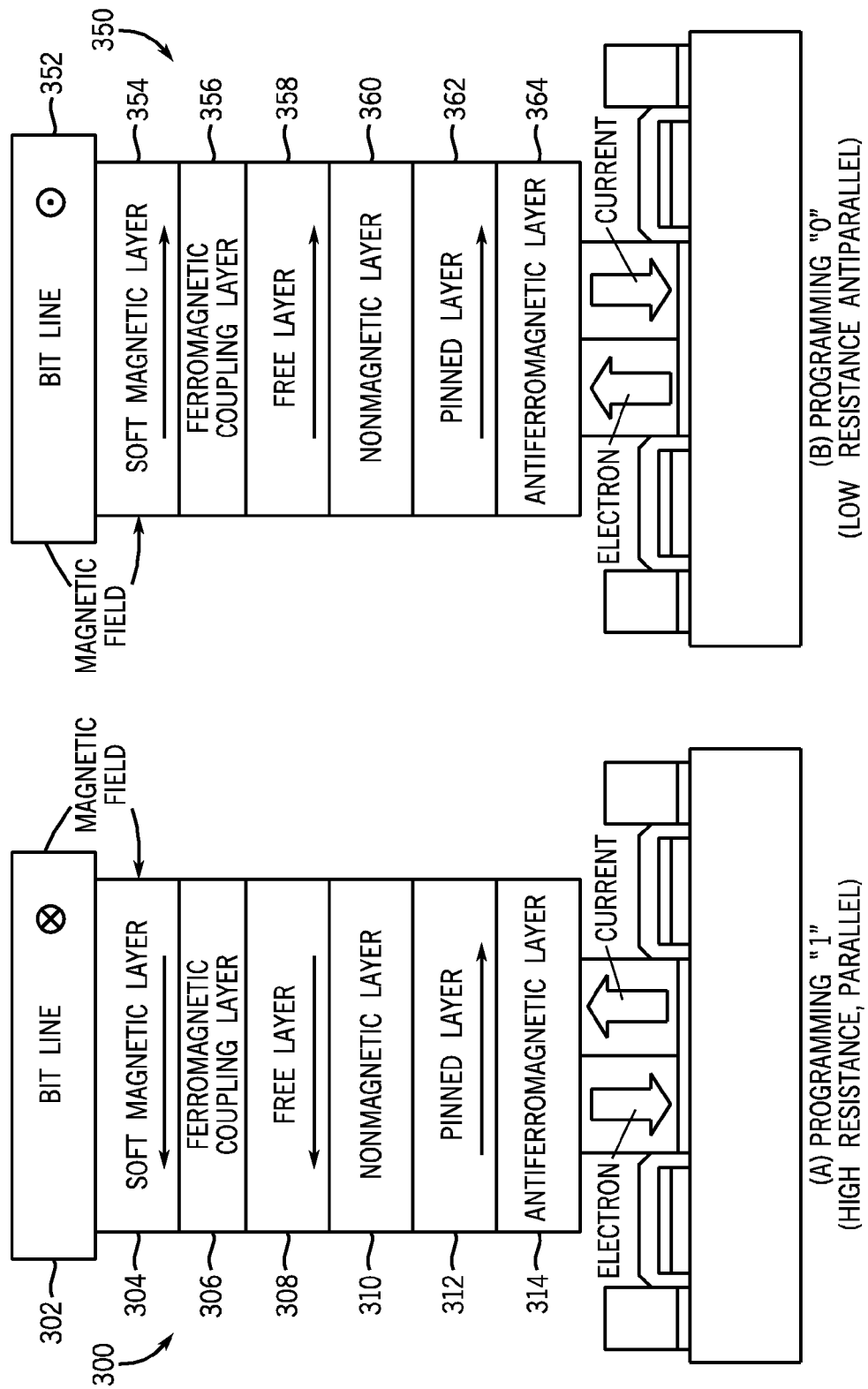

SPIN TORQUE TRANSFER CELL STRUCTURE UTILIZING FIELD-INDUCED ANTIFERROMAGNETIC OR FERROMAGNETIC COUPLING

CROSS-REFERENCE TO RELATED APPLICATION

This application is a continuation of U.S. patent application Ser. No. 13/108,869, which was filed on May 16, 2011, now U.S. Pat. No. 8,218,357, which issued on Jul. 10, 2012, which is a continuation of U.S. patent application Ser. No. 12/265,340, which was filed on Nov. 5, 2008, now U.S. Pat. No. 7,944,738, which issued on May 17, 2011.

BACKGROUND

1. Field of Invention

The invention relates generally to magnetic random access memory, and more particularly, to Spin Torque Transfer Magnetic Random Access Memory (STT-MRAM).

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies which store data as electric charge, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic layers is typically high. Thus, when multiple cells are arranged in an MRAM array, the programming current directed to one memory cell may induce a field change in the free layer of an adjacent cell. This potential for writes disturbances, also known as the "half-select problem," can be addressed using a spin torque transfer technique.

A conventional spin torque transfer MRAM (STT-MRAM) cell includes a magnetic tunnel junction (MTJ), which is a magnetoresistive data storing element including two magnetic layers (one pinned and one free) and an insulating layer in between, a bit line, a word line, a source line, and an access transistor. A programming current typically flows through the access transistor and the MTJ. The pinned layer polarizes the electron spin of the programming current, and torque is created as the spin-polarized current passes through the MTJ. The spin-polarized electron current interacts with the free layer by exerting a torque on the free layer. When the torque of the spin-polarized electron current passing through the MTJ is greater than the critical switching current density ($J_c$), the torque exerted by the spin-polarized electron current is sufficient to switch the magnetization of the free layer. Thus, the magnetization of the free layer can be aligned to be either parallel or antiparallel to the pinned layer, and the resistance state across the MTJ is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between high and low resistance states, improving read operations in the magnetic domain.

However, high programming current densities through the STT-MRAM cell may still be problematic. High current densities through the magnetic layers may increase the energy consumption in the cell and the thermal profile in the layers, affecting the cell's integrity and reliability, and may also lead to larger silicon real estate consumption for each cell.

BRIEF DESCRIPTION OF DRAWINGS

Certain embodiments are described in the following detailed description and in reference to the drawings in which:

FIGS. 4A and 4B depict two STT-MRAM cell stacks utilizing antiferromagnetic coupling and responding to different directions of current in accordance with embodiments of the present invention; and FIGS. 5A and 5B depict two STT-MRAM cell stacks utilizing ferromagnetic coupling and responding to different directions of current in accordance with embodiments of the present invention.

DETAILED DESCRIPTION

As previously discussed, a spin torque transfer magnetic random access memory (STT-MRAM) cell is programmed by switching the magnetization of the free layer in the cell's magnetic tunnel junction (MTJ). Switching occurs when the current density passing through the memory cell is larger than the critical switching current density. Thus, to program the cell, the programming current density need only be slightly higher than the critical switching current density. Since passing a larger programming current increases the energy consumption and the thermal profile in the MTJ, which affects the integrity and reliability of the cell, it is desirable to decrease the critical switching current without affecting the cell's thermal stability. Decreasing the critical switching current would allow a smaller current to switch the free layer when programming the cell. The following discussion describes the systems and devices, and the operation of such systems and devices in accordance with the embodiments of the present technique.

Figure 1:
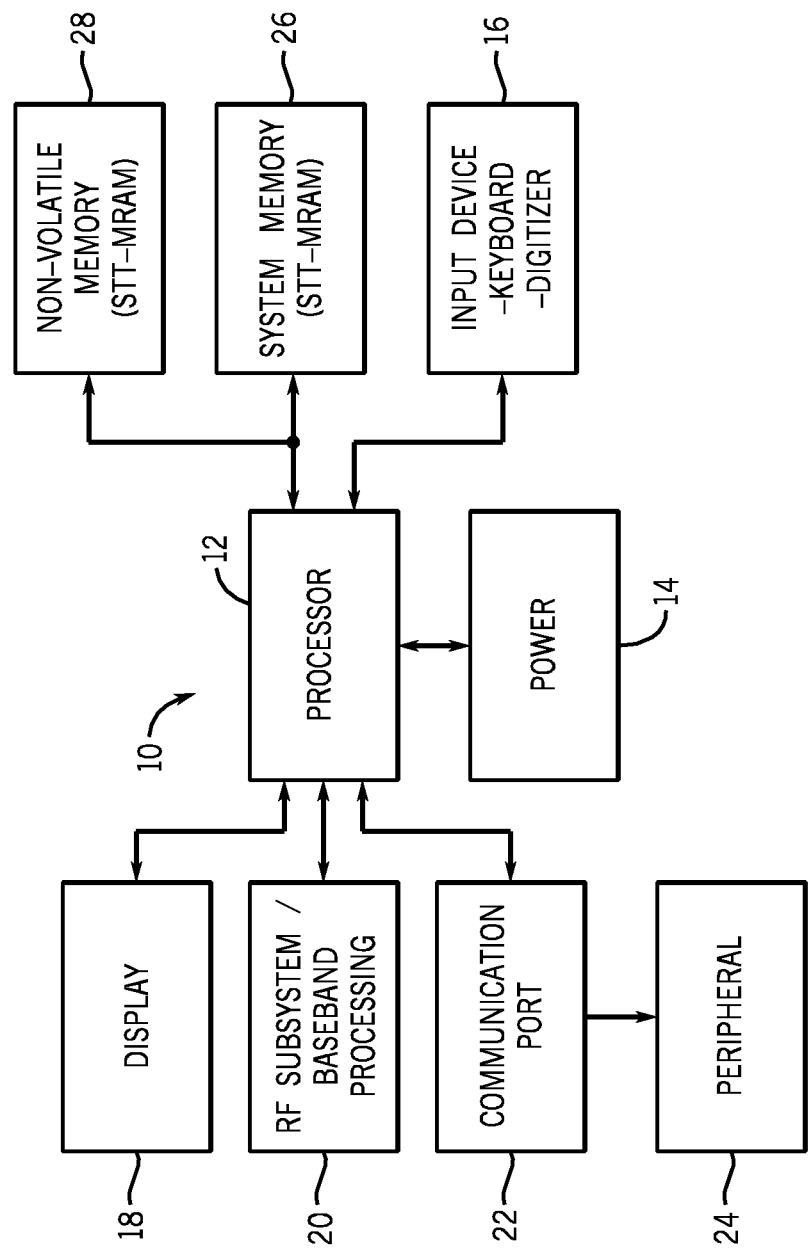
FIG. 1 depicts a block diagram of a processor-based system in accordance with an embodiment of the present technique.

FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include spin torque transfer magnetic random access memory (STT-MRAM), magnetic random access memory (MRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include STT-MRAM devices, such as those discussed further below.

The processor 12 may also be coupled to non-volatile memory 28, which is not to suggest that system memory 26 is necessarily volatile. The non-volatile memory 28 may include STT-MRAM, MRAM, read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include STT-MRAM devices manufactured in accordance with embodiments of the present technique.

Figure 2:
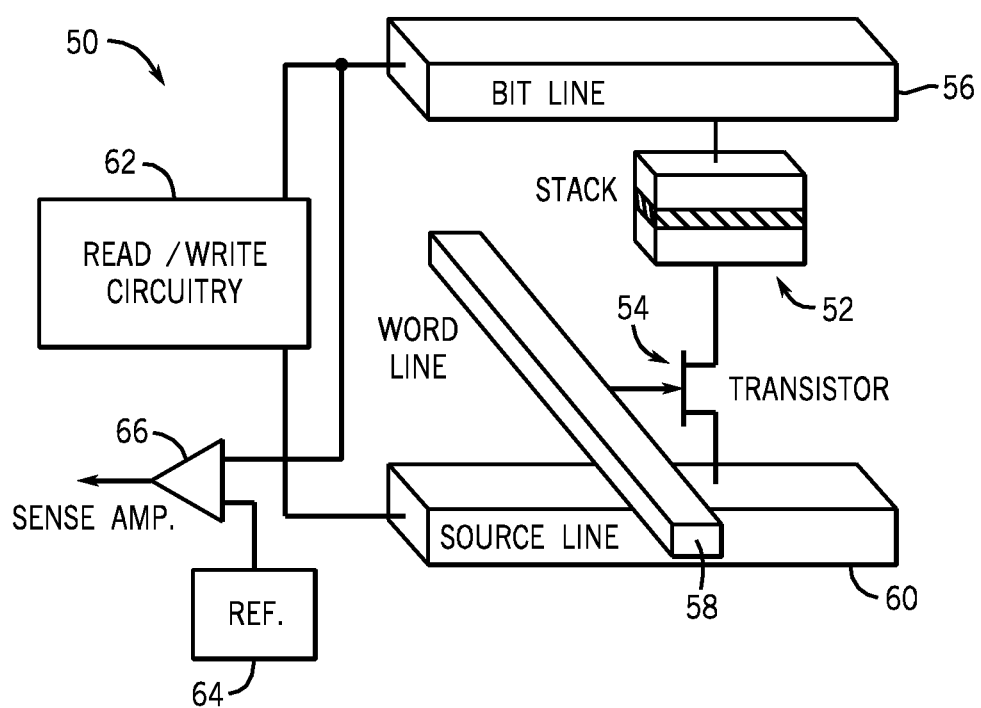
FIG. 2 depicts a schematic diagram of a portion of a memory array having memory cells fabricated in accordance with embodiments of the present invention.

FIG. 2 illustrates an STT-MRAM cell 50, which may be fabricated to form an array of memory cells in a grid pattern including a number of rows and columns, or in various other arrangements depending on the system requirements and fabrication technology. An arrangement of memory cells may be implemented in the system memory 26 or the volatile memory 28 depicted in FIG. 1.

Figure 3:
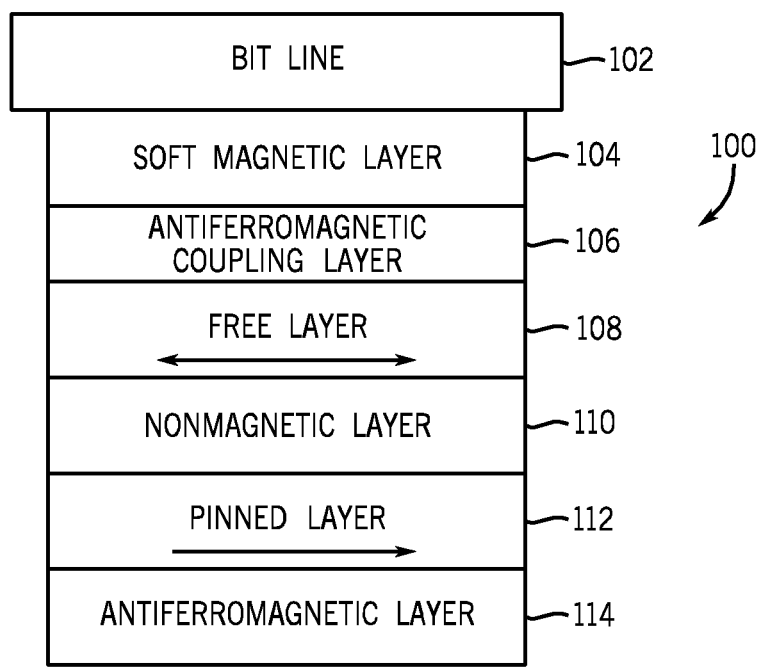
FIG. 3 depicts a STT-MRAM cell stack with a soft magnetic layer and an antiferromagnetic coupling layer in accordance with embodiments of the present invention.

STT-MRAM cell 50 includes a stack 52, an access transistor 54, a bit line 56, a word line 58, a source line 60, read/write circuitry 62, a bit line reference 64, and a sense amplifier 66. The stack 52 may include a magnetic tunnel junction (MTJ) or a spin valve. As will be described further below with specific reference to FIGS. 3-5, the stack 52 may further include a soft magnetic layer and a coupling layer in accordance with embodiments of the present technique. In various embodiments described below, the soft magnetic layer and coupling layer in the stack 52 may be layers disposed on or below the MTJ of the stack 52 (FIGS. 3-5).

As used herein, the STT-MRAM cell 50 generally includes a "magnetic cell structure." The magnetic cell structure may be an MTJ, as discussed above, if a nonmagnetic layer between a free layer and a pinned layer of the stack 52 is insulative. Alternatively, the magnetic cell structure may be a spin valve, if the nonmagnetic layer between the free layer and the pinned layer is conductive. As used in the present specification, the term "stack" may include a magnetic cell structure, and may refer to a memory cell stack, magnetic cell stack, STT-MRAM cell stack, or any component of a memory cell which may include layers and materials in accordance with an embodiment of the present technique. Further, as will be explained, the "coupling layer" may be an antiferromagnetic coupling layer or a ferromagnetic coupling layer.

As also used herein, materials may be referred to as a "layer" when the material is formed above or below the MTJ or within the MTJ stack, and parallel to the layers of the MTJ. It should be understood that when a layer is said to be "formed on," "formed below," "disposed on," or "disposed below" another layer, there may be intervening layers formed or disposed between those layers. Conversely, if a layer or material is said to be "formed directly on," "formed directly below," "disposed directly on," "disposed directly below," or "in direct contact with," the materials or layers include no intervening materials or layers therebetween.

When the STT-MRAM cell 50 is selected to be programmed, a programming current is applied to the cell, and the current is spin-polarized by the pinned layer and exerts a torque on the free layer, which switches the magnetization of the free layer to "write to" or "program" the cell. In a read operation of the STT-MRAM cell 50, a current is used to detect the resistance state of the memory cell stack 52. As will be further discussed, incorporating a soft magnetic layer and a coupling layer in the stack 52 may decrease the critical switching current required to switch the magnetization of the free layer, thus allowing a smaller programming current to write the STT-MRAM cell 50.

As previously discussed, a programming current is applied for the write operation of the STT-MRAM cell 50. To initiate the write operation, the read/write circuitry 62 may generate a write current to the bit line 56 and the source line 60. The polarity of the voltage between the bit line 56 and the source line 60, along with the coupling effect between the soft magnetic layer and the free layer, determines the switch in magnetization of the free layer in the stack 52. Once the free layer is magnetized according to the spin polarity of the programming current and the coupling effect, the programmed state is written to the STT-MRAM cell 50.

To read the STT-MRAM cell 50, the read/write circuitry 62 generates a read current to the bit line 56 and the source line 60 through the stack 52 and the transistor 54. The programmed state of the STT-MRAM cell 50 depends on the resistance across the stack 52 which may be determined by the voltage difference between the bit line 56 and the source line 60. In some embodiments, the voltage difference may be compared to a reference 64 and amplified by a sense amplifier 66.

One embodiment of the present invention, utilizing a coupling effect in an STT-MRAM cell, is illustrated in FIG. 3. The STT-MRAM cell includes a memory cell stack 100, having a soft magnetic layer 104 and an antiferromagnetic layer 106 which may be employed to decrease the critical switching current density, or the current density at which the free layer of a magnetic memory cell may be switched. This technique enables a lower programming current applied through the bit line 102 to facilitate a switch in the magnetization of the free layer 108 to program the memory cell. This embodiment, and each of the embodiments illustrated and described in the figures below, may be incorporated into the STT-MRAM cell 50, and further incorporated into an STT-MRAM cell array, as described in FIG. 2.

The memory cell stack 100 of FIG. 3 may include a free layer 108 and a pinned layer 112 with a nonmagnetic layer 110 in between. The pinned layer 112 is so named because it has a magnetization with a fixed or preferred orientation, and this is represented by the unidirectional arrow illustrated in the pinned layer 112. The free layer 108 has a magnetization which may be switched, as represented by the bidirectional arrow, allowing the memory cell to be programmed. As previously discussed, switching the magnetization of the free layer 108 changes the resistance across the free layer 108 and the pinned layer 112 such that the memory cell is programmed to either a low resistance state (when the free layer 108 and the pinned layer 112 have parallel magnetizations) or a high resistance state (when the free layer 108 and the pinned layer 112 have antiparallel magnetizations). The cell may be read by determining the resistance across the free layer 108 and the pinned layer 112.

Switching the magnetization of the free layer 108 occurs when a programming current passed through the memory cell has a current density that is greater than a critical switching current density. In one embodiment, a soft magnetic layer 104 and an antiferromagnetic coupling layer are incorporated in the stack 100. A programming current is passed through the bit line 102 of a memory cell selected for programming. The programming current generates a magnetic field in the bit line 102 which magnetizes the soft magnetic layer 104 of the selected memory cell stack 100. More specifically, the soft magnetic layer 104 has a high magnetic permeability such that the majority or substantially all of the magnetic field created in the bit line 102 by the programming current remains in the soft magnetic layer 104 and does not pass to the surrounding environment. The soft magnetic layer 104 also is an impermanent magnet and may be magnetized only when a magnetic field is created by a programming current. The soft magnetic layer 104 can thus be magnetized in a first direction in response to a programming current applied in one direction, or magnetized in a second direction in response to a programming current applied in another direction. Further, the soft magnetic layer 104 may either substantially lose its magnetization or retain only a small magnetization that is antiparallel to the free layer 108 when no programming current is applied, further increasing the thermal stability of the free layer 108.

Depending on the direction of the programming current, as will be further explained in FIGS. 4A-4B, the magnetic field generated by the current through the bit line 102 magnetizes the soft magnetic layer 104 in a direction that is either parallel or antiparallel to the pinned layer 112. Because the antiferromagnetic coupling layer 106 may comprise materials that align the magnetization of neighboring layers in opposite directions, the antiferromagnetic coupling layer 106 induces antiparallel coupling between the free layer 108 and the magnetized soft magnetic layer 104 that induces the free layer 108 to be magnetized in an orientation anti-parallel to the magnetization of the soft magnetic layer 104. This torque on the free layer 108 generated by the antiferromagnetic coupling effect reduces the critical switching current by exerting torque towards switching the magnetization of the free layer 108 in one direction so that less torque from the spin of the programming current is required to switch the magnetization of the free layer 108 in the same direction.

For example, if the memory cell is selected to be programmed to a high resistance state, a programming current may magnetize the soft magnetic layer 104 to a direction parallel to the pinned layer 112, and the antiferromagnetic coupling layer 106 may induce antiparallel coupling to switch the free layer 108 to be antiparallel to the soft magnetic layer 104, and thus antiparallel to the pinned layer 112. Then, less torque from the spin of the programming current may facilitate a switch in the magnetization of the free layer 108 to be antiparallel to the pinned layer 112 to program the memory cell to a high resistance state. Further, an antiferromagnetic layer 114 may be deposited below the pinned layer 112 to achieve the pinning through exchange coupling and further increase cell stability.

The examples of materials discussed below may be used in an embodiment as in FIG. 3, or in any other embodiment in accordance with the present technique. In some embodiments, the free layer 108 and the pinned layer 112 may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The nonmagnetic layer 110 between the free layer 108 and the pinned layer 112 may comprise conductive materials such as Cu, Au, Ta, Ag, CuPt, CuMn, or nonconductive materials such as $Al_xO_y$, MgO, AN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials.

The soft magnetic layer 104 may have a high permeability. The relative permeability of a medium is defined by a ratio of the permeability of a specific medium to the permeability of free space, where the permeability of free space is $\mu_0 = 4\pi \times 10^{-7}$. The relative permeability ratio is $\mu_r = \mu/\mu_0$, where $\mu$ is the magnetic permeability of the medium. In some embodiments, the soft magnetic layer 104 may have a relative permeability greater than or equal to 500 and may include, for example, Co—Zr—Pd—Mn, Si-doped (3%-4%) Fe, Co—Fe, Ni—Fe, Ni—Fe—Cu—Cr, an Ni—Fe—Cu—Mo alloy, FeXN, X=Al, Ta, Rh, Mo, Si, Zr, Mn—Zn ferrite, Ni—Zn ferrite, MFe2O4, M=Mn, Fe, Co, Ni, Cu, Zn, Mg, Cd, a Co-based amorphous metal, a Fe-based amorphous metal, or nanocrystalline Fe—Nb—Si—B or Fe—Zr—B—Cu, or any combination of the above materials.

Though the soft magnetic layer 104 is depicted as disposed in contact with the bit line 102, the soft magnetic layer 104 does not necessarily have to be in contact with the bit line 102. Some embodiments may include a layer in between the soft magnetic layer 104 and the bit line 102, and the layer may have properties that do not substantially affect the ability of the soft magnetic layer 104 to be magnetized by the bit line 102. For example, a layer in between the soft magnetic layer 104 and the bit line 102 may be thin, and may comprise nonmagnetic materials including conductive materials such as Cu, Au, Ta, Ag, CuPt, CuMn, or nonconductive materials such as $Al_xO_y$, MgO, AN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials. The antiferromagnetic coupling layer 106 may have a thickness of approximately 0.2 nm to 10 nm or another thickness suitable for inducing antiparallel coupling between the free layer 108 and the soft magnetic layer 104. The antiferromagnetic coupling layer 106 may comprise, for example, Ru, Cr, Os, Mn, Nb, Rh, W, Re, Ir, V, or Mo, or any combination of the above materials. The antiferromagnetic layer 114 may comprise, for example, PtMn, NiMn, PdMn, IrMn, PdPtMn, MnO, MnS, MnTe, $MnF_2$, $FeF_2$, $FeCl_2$, FeO, $CoCl_2$, CoO, $NiCl_2$, Cr, or NiO, or any combination of these materials.

FIGS. 4A-4B depict two STT-MRAM cell stacks in accordance with an embodiment of the present invention and the response of each cell stack to programming current applied in different directions. In FIG. 4A, the memory cell stack 200 may have a free layer 208 and a pinned layer 212 with a nonmagnetic layer 210 in between. The stack 200 may also have a soft magnetic layer 204 and an antiferromagnetic coupling layer 206 on the free layer 208, and an antiferromagnetic layer 214 below the pinned layer 212. A bit line 202 is configured to supply programming current to the stack 200. When a programming current flows in a direction into the page through the bit line 202 and down through the memory cell stack 200, a magnetic field is generated around the bit line 202 and induces a magnetization in the soft magnetic layer 204 to the left, antiparallel to the right-oriented magnetization of the pinned layer 212. As previously discussed, with reference to FIG. 3, the high permeability of the soft magnetic layer 204 concentrates the magnetic field and creates a large magnetization. The antiferromagnetic coupling layer 206 creates a torque to align the magnetization of the free layer 208 in a direction antiparallel to the magnetization of the soft magnetic layer 204, or to the right.

Furthermore, the spin-torque of the upward flowing electrons from the downward flowing programming current also creates a spin-torque to align the magnetization of the free layer 208 to the right. Because the antiferromagnetic coupling effect created by the antiferromagnetic coupling layer 206 between the soft magnetic layer 204 and the free layer 208 facilitates in aligning the magnetization of the free layer 208 to the same direction (to the right), the programming current spin-torque needed to align the magnetization of the free layer 208 to the right is reduced. Thus, a smaller programming current can switch the magnetization direction of the free layer 208 to the right, or parallel to the magnetization of the pinned layer 212, and the STT-MRAM cell is programmed to a low resistance state (write "0").

As depicted in FIG. 4B, the memory cell stack 250 may also respond to a programming current applied in another direction. The stack 250 may have a free layer 258 and a pinned layer 262 with a nonmagnetic layer 260 in between. The stack 250 may also have a soft magnetic layer 254 and an antiferromagnetic coupling layer 256 on the free layer 258, and an antiferromagnetic layer 264 below the pinned layer 262. A bit line 252 is configured to supply programming current to the stack 250. When a programming current flows in a direction out of the page through the bit line 252 and up the memory cell stack 250, a magnetic field is generated around the bit line 252 and induces a magnetization in the soft magnetic layer 254 to the right, parallel to the right-oriented magnetization of the pinned layer 262. The high permeability of the soft magnetic layer 254 concentrates the magnetic field, creating a large magnetization, and the antiferromagnetic coupling layer 256 creates a torque to align the magnetization of the free layer 258 in a direction antiparallel to the magnetization of the soft magnetic layer 254, or to the left.

Furthermore, the spin-torque of the downward flowing electrons from the upward flowing programming current also creates a spin-torque to align the magnetization of the free layer 258 to the left. Specifically, the electrons are spin polarized when they flow to the pinned layer 262, and the electrons that are polarized in a direction antiparallel from the magnetization of the pinned layer 262 are reflected up to the free layer 258, aligning the magnetization of the free layer 258 in a direction antiparallel to the magnetization of the pinned layer 262, or to the left. Because the antiferromagnetic coupling effect created by the antiferromagnetic coupling layer 256 between the soft magnetic layer 254 and the free layer 258 facilitates in aligning the magnetization of the free layer 258 to the same direction (to the left), the programming current spin-torque needed to align the magnetization of the free layer 258 to the left is reduced. Thus, a smaller programming current can switch the magnetization direction of the free layer 258 to the left, or antiparallel to the magnetization of the pinned layer 262, and the STT-MRAM cell is programmed to a high resistance state (write "1").

Another embodiment of the present invention, reducing the programming current by utilizing a coupling effect, is illustrated in FIGS. 5A-5B where two STT-MRAM cell stacks 300 and 350, each incorporating a soft magnetic layer 304 and 354 and a ferromagnetic coupling layer 306 and 356, respond to programming currents of different directions. As will be further explained, similar to the antiferromagnetic coupling layer in some embodiments (106 in FIGS. 3 and 206 and 256 in FIGS. 4A-4B), the ferromagnetic coupling layer also facilitates reducing the programming current through a coupling effect, but the ferromagnetic coupling layer induces a parallel coupling effect between the soft magnetic layer and the free layer. The parallel coupling effect may be induced by materials in the ferromagnetic coupling layer that show oscillatory coupling behavior, aligning adjacent atomic spins to be parallel to each other. The ferromagnetic coupling layer 306 and 356 may have a thickness of approximately 0.2 nm to 10 nm and may comprise, for example, Ru, Au, Mn, Os, Ir, Rh, Cu, Cr, a CoRu alloy or a CoRu alloy doped with B, Ru and Cr, a CoCr alloy, Pt, or Pd or any other alloys or other combinations of the above materials.

In FIG. 5A, the memory cell stack 300 may have a free layer 308 and a pinned layer 312 with a nonmagnetic layer 310 in between. The stack 300 may also have a soft magnetic layer 304 and a ferromagnetic coupling layer 306 on the free layer 308, and an antiferromagnetic layer 314 below the pinned layer 312. A bit line 302 is configured to supply programming current to the stack 300. When a programming current flows in a direction into the page through the bit line 302 and up the memory cell stack 300, a magnetic field is generated around the bit line 302 and induces a magnetization in the soft magnetic layer 304 to the left, antiparallel to the right-oriented magnetization of the pinned layer 312. The high permeability of the soft magnetic layer 304 concentrates the magnetic field, creating a large magnetization, and the ferromagnetic coupling layer 306 creates a torque to align the magnetization of the free layer 308 in a direction parallel to the magnetization of the soft magnetic layer 304, or to the left.

Furthermore, the spin-torque of the downward flowing electrons from the upward flowing programming current also creates a spin-torque to align the magnetization of the free layer 308 to the left. Specifically, the electrons are spin polarized when they flow to the pinned layer 312, and the electrons that are polarized in a direction antiparallel from the magnetization of the pinned layer 312 are reflected up to the free layer 308, aligning the magnetization of the free layer 308 in a direction antiparallel to the magnetization of the pinned layer 312, or to the left. Because the ferromagnetic coupling effect created by the ferromagnetic coupling layer 306 between the soft magnetic layer 304 and the free layer 308 facilitates in aligning the magnetization of the free layer 308 in the same direction (to the left), the programming current spin-torque needed to align the magnetization of the free layer 308 to the left is reduced. Thus, a smaller programming current can switch the magnetization direction of the free layer 308 to the left, or antiparallel to the magnetization of the pinned layer 312, and the STT-MRAM cell is programmed to a high resistance state (write "1").

As depicted in FIG. 5B, the memory cell stack 350 responds to a programming current applied in another direction from the programming current applied to the previously discussed memory cell stack 300. The stack 350 may have a free layer 358 and a pinned layer 362 with a nonmagnetic layer 360 in between. The stack 350 may also have a soft magnetic layer 354 and a ferromagnetic coupling layer 356 on the free layer 358, and an antiferromagnetic layer 364 below the pinned layer 362. A bit line 352 is configured to supply programming current to the stack 350. When a programming current flows in a direction out of the page through the bit line 352 and down the memory cell stack 350, a magnetic field is generated around the bit line 352 and induces a magnetization in the soft magnetic layer 354 to the right, parallel to the right-oriented magnetization of the pinned layer 362. The high permeability of the soft magnetic layer 354 concentrates the magnetic field, creating a large magnetization, and the ferromagnetic coupling layer 356 creates a torque to align the magnetization of the free layer 358 in a direction parallel to the magnetization of the soft magnetic layer 354, or to the right.

Furthermore, the spin-torque of the upward flowing electrons from the downward flowing programming current also creates a spin-torque to align the magnetization of the free layer 358 to the right. Because the ferromagnetic coupling effect created by the ferromagnetic coupling layer 356 between the soft magnetic layer 354 and the free layer 358 facilitates in aligning the magnetization of the free layer 358 in the same direction (to the right), the programming current spin-torque needed to align the magnetization of the free layer 358 to the right is reduced. Thus, a smaller programming current can switch the magnetization direction of the free layer 358 to the right, or parallel to the magnetization of the pinned layer 362, and the STT-MRAM cell is programmed to a low resistance state (write "0").

In embodiments in accordance with the present technique, the direction of the current through the bit line determines the magnetization of the soft magnetic layer, and the direction of the spin-torque from the programming current flowing up or down the stack determines the magnetization of the free layer. The current through the bit line may flow in either direction (e.g., into or out of the page) and may depend on which side of a memory array the bit line current is sunk to. To achieve different resistance states, the programming current may be applied in different directions, and the direction of the programming current applied may depend on the configuration of the STT-MRAM array and/or the direction of the current flow through the bit line of the STT-MRAM cell.

Furthermore, in embodiments in accordance with the present technique, the pinned layer of the STT-MRAM cell may have a fixed or preferred magnetization orientation in any direction, and is not necessarily magnetized to the right. A STT-MRAM cell with a pinned layer magnetized to the left would still function in accordance with the present technique, only the resistance states in response to different programming current directions would be the opposite from embodiments where the pinned layer is magnetized to the right.

In addition to decreasing the energy barrier and requiring a smaller programming current to switch the magnetization of the free layer of a memory cell, the impermanent magnetization characteristic of the soft magnetic layer may preserve thermal stability required for data retention. Only when the memory cell is being programmed will the soft magnetic layer be substantially magnetized, allowing the coupling layer to induce a coupling effect on the free layer. When the memory cell is not being programmed, the coupling effect will not be induced or will be small in magnitude, and the remnant coupling effect may help to stabilize the cell after switching.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory cell comprising:
   a magnetic cell structure comprising a magnetic tunnel junction (MTJ) or a spin valve; and
   one or more layers of material formed on the magnetic cell structure and configured to decrease a critical switching current density of the magnetic cell structure, wherein at least one of the one or more layers has a magnetic permeability such that a majority or substantially all of a magnetic field generated by applying a programming current to the memory cell remains in the at least one of the one or more layers of material.

2. The memory cell, as set forth in claim 1, wherein the one or more layers of material comprise a soft magnetic material.

3. The memory cell, as set forth in claim 2, wherein the soft magnetic material does not retain substantial magnetization when a programming current is not applied to the memory cell.

4. The memory cell, as set forth in claim 2, wherein the soft magnetic material is magnetizable by a magnetic field generated by applying a programming current.

5. The memory cell, as set forth in claim 2, wherein the soft magnetic material has a relative permeability greater than or equal to 500.

6. The memory cell, as set forth in claim 1, wherein the one or more layers of material comprise a coupling layer.

7. The memory cell, as set forth in claim 6, wherein the coupling layer comprises an antiferromagnetic coupling layer.

8. The memory cell, as set forth in claim 1, wherein the magnetic cell structure comprises:
a free layer;
a pinned layer; and
a nonmagnetic layer disposed between the free layer and the pinned layer.

9. The memory cell, as set forth in claim 1, wherein the memory cell comprises an access transistor electrically coupled to the magnetic cell structure and configured to provide electrical access to the magnetic cell structure.

10. The memory cell, as set forth in claim 9, wherein:
a gate of the access transistor is coupled to a word line of a memory array; and
the memory cell is electrically coupled between a bit line and a source line to facilitate reading from and writing to the magnetic cell structure.

11. A memory cell comprising:
a pinned ferromagnetic layer;
a nonmagnetic layer formed on the pinned ferromagnetic layer;
a free ferromagnetic layer formed on the nonmagnetic layer;
one or more layers of material formed on the free ferromagnetic layer, wherein at least one of the one or more layers has a magnetic permeability such that a majority or substantially all of a magnetic field generated by applying a programming current to the memory cell remains in the at least one of the one or more layers of material.

12. The memory cell, as set forth in claim 11, wherein the at least one of the one or more layers of material comprises a soft magnetic layer.

13. The memory cell, as set forth in claim 12, comprising a bit line configured to apply the programming current to the memory cell.

14. The memory cell, as set forth in claim 13, wherein the bit line can carry a bit current in either direction, and wherein a direction of a programming current through the memory cell is based on the direction of the bit current.

15. The memory cell, as set forth in claim 11, wherein the soft magnetic layer comprises Co—Zr—Pd—Mn, Si-doped (3%-4%) Fe, Co—Fe, Ni—Fe, Ni—Fe—Cu—Cr, an Ni—Fe—Cu—Mo alloy, FeXN, X=Al, Ta, Rh, Mo, Si, Zr, Mn—Zn ferrite, Ni—Zn ferrite, Mfe2O4, M=Mn, Fe, Co, Ni, Cu, Zn, Mg, Cd, a Co-based amorphous metal, a Fe-based amorphous metal, or nanocrystalline Fe—Nb—Si—B or Fe—Zr—B—Cu, or any combination thereof.

16. The memory cell, as set forth in claim 11, wherein the one or more layers of material comprise a coupling layer.

17. The memory cell, as set forth in claim 16, wherein the coupling layer comprises an antiferromagnetic coupling layer.

18. The memory cell, as set forth in claim 17, wherein the antiferromagnetic coupling layer comprises Ru, Cr, Os, Mn, Nb, Rh, W, Re, Ir, V, or Mo, or any combination thereof.

19. The memory cell, as set forth in claim 11, wherein the at least one of the one or more layers of material comprises a soft magnetic layer, and wherein the one or more layers of material comprise a coupling layer.

20. The memory cell, as set forth in claim 19, wherein the coupling layer is configured to induce the magnetization of the free ferromagnetic layer to a direction antiparallel from a magnetization of the soft magnetic layer.

21. The memory cell, as set forth in claim 19, wherein the coupling layer is configured to induce the magnetization of the free ferromagnetic layer to a direction parallel to a magnetization of the soft magnetic layer.

22. A system comprising:
a processor; and
a spin torque transfer magnetic random access memory (STT-MRAM) array, wherein each memory cell of the array comprises:
a magnetic cell stack; and
one or more layers of material formed on the magnetic cell stack and configured to decrease the critical switching current density of the magnetic cell stack, wherein the one or more layers of material comprise a soft magnetic material.

23. The system, as set forth in claim 22, wherein the magnetic cell stack comprises:
a free layer;
a pinned layer; and
a nonmagnetic layer disposed between the free layer and the pinned layer.

24. The system, as set forth in claim 22, wherein the soft magnetic material does not retain substantial magnetization when a programming current is not applied to the memory cell.

25. The system, as set forth in claim 22, wherein the soft magnetic material has a relative permeability greater than or equal to 500.

26. The system, as set forth in claim 22, wherein the one or more layers of material comprise a coupling layer.

27. The system, as set forth in claim 26, wherein the coupling layer comprises an antiferromagnetic coupling layer.

28. The system, as set forth in claim 22, wherein the array is part of system memory.

* * * * *

UNITED STATES PATENT AND TRADEMARK OFFICE
CERTIFICATE OF CORRECTION

PATENT NO. : 8,665,640 B2  
APPLICATION NO. : 13/544670  
DATED : March 4, 2014  
INVENTOR(S) : Jun Liu et al.

Page 1 of 1

It is certified that error appears in the above-identified patent and that said Letters Patent is hereby corrected as shown below:

On the title page, in item (73), under "Assignee", in column 1, line 1, delete "Technologies," and insert -- Technology, --, therefor.

On the title page, in item (56), under "Other Publications", in column 2, line 2, delete "Ottawo," and insert -- Ottawa, --, therefor.

In the Claims

In column 11, line 49, in Claim 15, delete "Mfe2O4," and insert -- MFe2O4, --, therefor.

Signed and Sealed this  
Fourth Day of November, 2014

Michelle K. Lee  
*Deputy Director of the United States Patent and Trademark Office*